United States Patent
Fukuoka et al.

(10) Patent No.: US 8,093,142 B2
(45) Date of Patent: Jan. 10, 2012

(54) PLASMA PROCESSING APPARATUS AND PLASMA PROCESSING METHOD

(75) Inventors: Yusuke Fukuoka, Nara (JP); Katsushi Kishimoto, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 271 days.

(21) Appl. No.: 12/094,816

(22) PCT Filed: Nov. 16, 2006

(86) PCT No.: PCT/JP2006/322844
§ 371 (c)(1),
(2), (4) Date: Mar. 9, 2009

(87) PCT Pub. No.: WO2007/060876
PCT Pub. Date: May 31, 2007

(65) Prior Publication Data
US 2009/0253246 A1    Oct. 8, 2009

(30) Foreign Application Priority Data
Nov. 25, 2005  (JP) ................................. 2005-340847

(51) Int. Cl.
*H01L 21/00* (2006.01)
*C23C 16/00* (2006.01)

(52) U.S. Cl. .................... 438/485; 118/722; 118/723 R; 118/724; 438/787; 438/788; 438/798; 438/706

(58) Field of Classification Search .................. 438/485, 438/706–732, 787–794, 798, FOR. 117; 118/722, 723–724; 156/345.43–345.47; 315/111.21

See application file for complete search history.

(56) References Cited

U.S. PATENT DOCUMENTS
4,148,705 A   4/1979 Battey et al.
(Continued)

FOREIGN PATENT DOCUMENTS
EP      1 420 081 A2   4/2004
(Continued)

OTHER PUBLICATIONS

TW Office Action mailed Jan. 5, 2010 in corresponding TW application 09920001390.

(Continued)

*Primary Examiner* — Michael Lebentritt
*Assistant Examiner* — Karen Kusumakar
(74) *Attorney, Agent, or Firm* — Nixon & Vanderhye P.C.

(57) ABSTRACT

There is provided a plasma processing device capable of forming a film in a favorable manner irrespective of deflection generated in an anode electrode and a cathode electrode in the case where an area of the electrodes is increased.

A plasma processing device 100 includes a chamber 15, a gas introducing portion 28, an exhaust unit 29, and a high-frequency power supply unit 30. In the chamber 15, there are provided an anode electrode (first electrode) 4 having a flat-plate shape, a cathode electrode (second electrode) 12 having a flat-plate shape, and first supporting members 6 and second supporting members 5 for slidably supporting the two electrodes 4 and 12 in parallel with each other. The cathode electrode 12 is provided so as to face the anode electrode 4. The anode electrode 4 and the cathode electrode 12 are not fixed with screws or the like but are merely placed on the first supporting members 6 and the second supporting members 5. In the anode electrode 4 and the cathode electrode 12, deflection amounts when they are freely deflected under their own weights are equal to each other, and maximum deflection amounts of the two electrodes 4 and 12 are also equal to each other.

7 Claims, 1 Drawing Sheet

U.S. PATENT DOCUMENTS

| | | | |
|---|---|---|---|
| 4,264,393 A | | 4/1981 | Gorin et al. |
| 5,074,456 A | * | 12/1991 | Degner et al. ............... 228/121 |
| 6,461,444 B1 | * | 10/2002 | Nishio et al. ................. 134/29 |
| 2001/0031557 A1 | * | 10/2001 | Lilleland et al. ............. 438/689 |
| 2002/0078892 A1 | * | 6/2002 | Takahashi ..................... 118/719 |
| 2004/0069230 A1 | * | 4/2004 | Fukuoka et al. ............ 118/723 E |
| 2004/0173313 A1 | * | 9/2004 | Beach ........................ 156/345.33 |

FOREIGN PATENT DOCUMENTS

| | | |
|---|---|---|
| JP | 2004-149917 A | 5/2004 |
| JP | 2005-260251 | 9/2005 |
| JP | 2005-333096 | 12/2005 |
| JP | 2006-086470 | 3/2006 |
| TW | 1313574 B | 8/2009 |

OTHER PUBLICATIONS

International Search Report for PCT/JP2006/322844 dated Feb. 13, 2007.

Supplementary EP Search Report mailed Mar. 23, 2010 in corresponding EP application 06832733.7.

\* cited by examiner

PLASMA PROCESSING APPARATUS AND PLASMA PROCESSING METHOD

This application is the U.S. national phase of International Application No. PCT/JP2006/322844 filed 16 Nov. 2006 which designated the U.S. and claims priority to Japanese Application No. 2005-340847 filed 25 Nov. 2005, the entire contents of each of which are hereby incorporated by reference.

TECHNICAL FIELD

The present invention relates to a plasma processing device for manufacturing a semiconductor thin film and a method for plasma processing using the same, more particularly to a plasma processing device which uses a reaction chamber into which a reactant gas is introduced and a method for plasma processing using the same.

BACKGROUND ART

Conventionally, as a plasma processing device of the foregoing type, there is known a device capable of improving the uniformity in an etching or vapor deposition process in the plasma chemical technology (for example, see the Patent Document 1).

Patent Document 1: Specification of U.S. Pat. No. 4,264,393

A plasma CVD device used for manufacturing a semiconductor thin film is generally provided with a cathode and an anode which are provided and supported as a pair, a device for applying high-frequency power to one of the cathode and the anode each having a flat-plate shape, and a device for supplying a reactant gas for the formation of the thin film. In the plasma CVD device, plasma is generated in such a manner that high-frequency power is applied while the reactant gas is supplied between the cathode and the anode. As a result, a thin film is generated on a surface of a substrate provided between the cathode and the anode.

A distance between the cathode and the anode is referred to as an inter-electrode distance. The inter-electrode distance includes a certain range where plasma can be effectively generated. In the range, the inter-electrode distance is controlled, and the distance is desirably controlled as accurately as possible. The inter-electrode distance is generally controlled with accuracy in the order of $\frac{1}{100}$ relative to the inter-electrode distance, in other words, with accuracy of approximately 1% of the inter-electrode distance. In a method of controlling the inter-electrode distance, a sufficient level of rigidity of the cathode and the anode, which are electrodes, is secured relative to their sizes, so that any deflection is not generated in the provided cathode and anode.

DISCLOSURE OF THE INVENTION

Problem to be Solved by the Invention

However, the conventional technology has a problem that sufficient rigidity of the electrodes is not obtained in the case where the electrodes are larger and the substrate is accordingly increased in size, which makes it impossible to secure desired accuracy for the inter-electrode distance. As a result, a film cannot be formed in a favorable manner in the plasma processing. In order to secure the desired accuracy in the inter-electrode distance, it may be possible to further increase the rigidity of the electrode, in which case, however, the plasma CVD device is inevitably increased in size as the thicknesses of the electrode are increased and an electrode supporting section is accordingly increased in size.

Therefore, a main object of the present invention is to provide a plasma processing device capable of forming a film in a favorable manner irrespective of any deflection generated in an anode and a cathode, which are electrodes having a flat-plate shape, in the case where an area of the electrodes is increased.

Means for Solving the Problem

According to one aspect of the present invention, there is provided a plasma processing device including a reaction chamber, a gas introducing portion for introducing a reactant gas into the reaction chamber, an exhaust unit for discharging the reactant gas from the reaction chamber, a first electrode and a second electrode supported in the reaction chamber and having a flat-plate shape, and a first supporting member and a second supporting member for supporting the first and second electrodes such that the electrodes face each other, wherein maximum deflection amounts of the first and second electrodes, which are maximum sinking distances thereof under their own weights, in a state where the first and second electrodes are supported by the first and second supporting members, are adapted to be equal to each other.

Effect of the Invention

With the plasma processing device according to the present invention, a semiconductor thin film uniformly formed on a surface of a substrate having a large area can be obtained with a simplified structure irrespective of any deflection generated in first and second electrodes having a flat-plate shape in the case where an area of the electrodes is increased.

DESCRIPTION OF REFERENCE SYMBOLS

Figure 1:
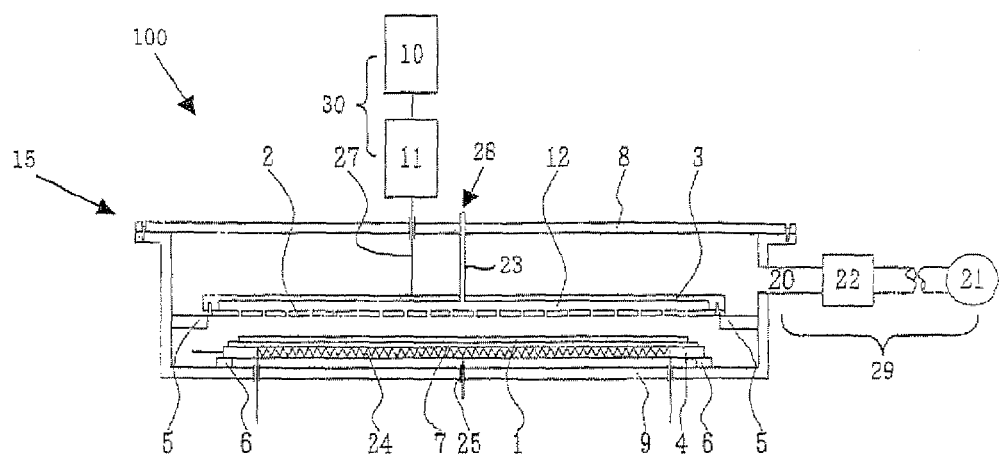
FIG. 1 is an illustration of an entire structure of a plasma processing device (thin film manufacturing device) according to a first embodiment of the present invention.

1 . . . substrate
2 . . . shower plate
3 . . . rear plate
4 . . . anode electrode
5 . . . second supporting member
6 . . . first supporting member
7 . . . tray
8 . . . door portion
9 . . . main body portion
10 . . . plasma exciting power supply
11 . . . impedance matching device
12 . . . cathode electrode
20 . . . exhaust tube
21 . . . vacuum pump
22 . . . pressure controller
23 . . . reactant gas tube
24 . . . heater
25 . . . thermocouple
26 . . . ground wire
27 . . . power introducing terminal
28 . . . gas introducing portion 29 . . . exhaust unit
30 . . . high-frequency power supply unit

BEST MODE FOR CARRYING OUT THE INVENTION

In a plasma processing device according to the present invention, shapes, sizes, and materials of first and second electrodes are adapted to be the same, for example, so that a maximum deflection amount of the first electrode, which is a maximum sinking distance thereof under its own weight, and a maximum deflection amount of the second electrode, which is a maximum sinking distance thereof under its own weight, are equal to each other. In this description (including the claims), the recitation "shapes, sizes, materials of first and second electrodes are adapted to be the same" means that there is not any substantive difference mainly between planar shapes, planar dimensions, thicknesses, and basic materials of the two electrodes from the viewpoint of the formation of a semiconductor thin film having desired characteristics on a surface of a substrate. "The maximum deflection amounts of the first and second electrodes are equal to each other" means that there is not any substantive difference between the maximum deflection amounts, which are the maximum sinking distances, when the two electrodes which are placed in a predetermined state are deflected under their own weights in accordance with the rigidity thereof and thereby sink by a certain distance, from the viewpoint of the formation of the semiconductor thin film having desired characteristics on the substrate surface.

The first and second electrodes may have a hollow structure. In that case, a flow path for the reactant gas or a heater for heating the electrodes may be provided in the respective hollow parts.

The first and second electrodes may be supported in, for example, peripheral portions thereof to be thereby movable in a limited range. Accordingly, the first and second electrodes can be freely deflected under their own weights, as a result of which the maximum deflection amounts of the two electrodes are equal to each other based on the constitutional characteristics described earlier.

A metal plate such as stainless steel or aluminum alloy may be used for the first and second electrodes. When these metal plates are annealed at a predetermined annealing temperature, remaining distortions in the metal plates due to a machining process or the like are eliminated, and the same maximum deflection amount can be thereby obtained in the two electrodes.

The maximum deflection amount, which is the maximum sinking distance, at the time is preferably at least 1% of an inter-electrode distance (distance between the first and second electrodes) because it would be difficult to place the two electrodes so that the maximum deflection amounts of the two electrodes can be equal to each other after they are compared to each other, when the maximum deflection amount fails to reach 1% of the inter-electrode distance. A substrate on which a film is formed through the plasma processing is deflected along the deflection of the first and second electrodes, and then, the thin film is formed thereon. A glass substrate or the like is used as the substrate.

In order to facilitate handling of the substrate, a film may be formed through the plasma processing in such a manner that a substrate formed from a material such as glass is placed on a tray having a thin-plate shape and formed from aluminum alloy or the like, and the substrate and the tray are deflected along the deflection of the first and second electrodes.

The plasma processing device according to the present invention is used when a silicon-based thin film is manufactured by the plasma CVD method, for example.

Examples of the silicon-based thin film include crystalline and amorphous thin films containing silicon as a main component. An example of the reactant gas is a gas containing a silicon element. More specifically, silane ($SiH_4$), disilane ($Si_2H_6$), or the like, can be used as the reactant gas, and the silane or disilane may be diluted with hydrogen ($H_2$) or helium (He).

Other examples of the silicon-based thin film manufactured by the plasma processing device according to the present invention include silicon carbide (SiC) film, silicon nitride (SiN) film, silicon oxide (SiO) film, SiGe film, and the like.

In order to manufacture a silicon carbide film, a gas containing a carbon element such as $CH_4$ or $C_2H_6$ is introduced as the reactant gas at the same time as the introduction of the gas containing the silicon element. In order to manufacture a silicon nitride film, a gas containing a nitrogen element such as $NH_3$ or NO is introduced as the reactant gas at the same time as the introduction of the gas containing the silicon element. In order to manufacture a silicon oxide film, a gas containing an oxygen element such as NO or $CO_2$ is introduced as the reactant gas at the same time as the introduction of the gas containing the silicon element. In order to manufacture a SiGe film, a gas containing a germanium element such as $GeH_4$ is introduced as the reactant gas at the same time as the introduction of the gas containing the silicon element.

Further, impurities may be doped into the silicon-based thin film in order to control conductivity. In that case, a gas containing impurities such as $PH_3$ is simultaneously introduced for the n-type, while a gas containing impurities such as $B_2H_6$ is simultaneously introduced for the p-type.

An example of the reaction chamber in the plasma processing device according to the present invention is a chamber capable of exhausting at least the inside thereof to be vacuum. Such a reaction chamber can be formed from, for example, stainless steel, aluminum alloy, or the like. In the case where at least two different members constitute the reaction chamber, the reaction chamber is preferably provided with an O-ring, or the like at their joint section to be completely sealed.

As the gas introducing portion in the plasma processing device according to the present invention can be used, for example, ones commonly used in the plasma CVD device; however, the gas introducing portion is not necessarily limited thereto.

For example, a vacuum pump, an exhaust tube which connects the reaction chamber to the vacuum pump, and a pressure controller provided at an intermediate position in the exhaust tube may constitute the exhaust unit in the plasma processing device according to the present invention.

In the plasma processing device according to the present invention, a high-frequency power supply unit for applying high-frequency power between the first and second electrodes is provided. For example, a plasma exciting power supply, an impedance matching device, and the like may constitute the high-frequency power supply unit.

In the plasma processing device according to the present invention, the first and second electrodes may be formed from a heat-resistant conductive material having a flat-plate shape such as stainless steel, aluminum alloy, carbon, or the like. It is preferable that the shapes, sizes, and materials of the first and second electrodes be the same. Further, in the case where there are remaining processing distortions resulting from the machining process or the like, it is preferable to eliminate them in an annealing process.

The first electrode may be an anode electrode having a hollow structure and provided with a heater therein, and the second electrode may be a cathode electrode having a hollow structure and provided with a large number of holes on a surface thereof facing the first electrode.

In the plasma processing device according to the present invention, first and second supporting members may support the first and second electrodes so that the first and second electrodes are orthogonal to the direction of gravitational force, in other words, so that they are horizontally supported. In the case where the first and second electrodes are substantially square, for example, in the foregoing constitution, four divided supporting pieces which support four corners of the first and second electrodes may constitute the first and second supporting members.

In the case where the four divided supporting pieces constitute the first and second supporting members, the four divided supporting pieces constituting the second supporting member may be fixed to upper ends of four support pillars extending vertically upward from a bottom surface of the reaction chamber.

The shapes and the constitutions of the first and second supporting members are not necessarily limited to those described above. The first and second supporting members may be, e.g., two pedestals having a frame shape which respectively support only edges of the first and second electrodes. Further, the two pedestals having the frame shape may be vertically coupled with each other to be integrally formed.

Thus, the shapes and the constitutions of the first and second supporting members are not subject to any particular limitation as far as they can support the first and second electrodes in parallel with each other and support at least one of the first and second electrodes in a slidable manner.

In the plasma processing device according to the present invention, both the first and second supporting members include engagement protrusions, the engagement protrusions loosely engaging to edges of the first and second electrodes. The engagement protrusions may be provided so that gaps are generated between the edges of the first and second electrodes and the respective engagement protrusions.

In the case where the four divided supporting pieces constitute the first and second supporting members as described above, each of the four divided supporting pieces may be provided with an engagement protrusion. In the case where the two pedestals having the frame shape constitute the first and second supporting members as described above, the respective engagement protrusions may be protruded along outer peripheries of the pedestals.

The first and second supporting members may be formed from an insulating material. An example of the insulating material constituting the first and second supporting members may be a heat-resistant material superior in insulating and thermal insulating properties such as glass, alumina, or zirconia. In the case where one of the first and second electrodes is provided, a conductor may be used in the supporting member on the side of the provided electrode.

A plurality of pairs of first and second electrodes and a plurality of pairs of first and second supporting members may be provided in one reaction chamber.

The first and second electrodes are freely deflected in the direction of gravitational force according to the supporting method described above. An amount of the free deflection, which is the sinking distance, is preferably at least 1% of the distance of the distance between the first and second electrodes (inter-electrode distance) as described above.

A substrate on which the thin film is formed is provided between the first and second electrodes, and the substrate is adapted to be very thin and deflected along the deflection of the first and second electrodes. A glass substrate, on a surface of which a transparent conductive film is applied, is a candidate for the substrate. The substrate may be set on a tray 7 formed from the same material as that of the first and second electrodes and then handled so that the substrate can be easily transported. The tray 7 has planar dimensions equal to or slightly larger than those of the substrate.

According to another aspect of the present invention, a plasma processing method is provided by means of the plasma processing device according to one aspect described above. In the plasma processing method, a substrate on which a thin film is to be formed is deflected along the deflection of first and second electrodes and provided between the two electrodes, a reactant gas is supplied into a reaction chamber, and high-frequency power is applied between the first and second electrodes so that a semiconductor thin film is formed on a surface of the substrate.

Preferred embodiments of the plasma processing device according to the present invention are described in detail below referring to the drawings. In the preferred embodiments described below, members commonly used are denoted by the same reference numerals.

First Embodiment

A plasma processing device for manufacturing a thin film according to a first embodiment of the present invention is described referring to FIG. 1 which shows an entire structure thereof.

As shown in FIG. 1, a plasma processing device 100 for manufacturing a thin film according to the first embodiment includes a chamber 15, a gas introducing portion 28 for introducing a reactant gas into the chamber 15, an exhaust unit 29 for discharging the reactant gas in the chamber 15, and a high-frequency power supply unit 30 for applying high-frequency power into the chamber 15.

In the chamber 15, there are provided a rectangular anode electrode (first electrode) 4 having a flat-plate shape, a rectangular cathode electrode (second electrode) 12 having a flat-plate shape, and first supporting members 6 and second supporting members 5 for slidably supporting the two electrodes 4 and 12 in parallel with each other. The cathode electrode 12 includes a shower plate 2 and a rear plate 3 and is provided so as to face the anode electrode 4.

A planar shape of the chamber 15 is rectangular, and the chamber 15 includes a main body portion 9 and a door portion 8. Both the main body portion 9 and the door portion 8 can be formed from stainless steel, aluminum alloy, or the like. A joint section of the main body portion 9 and the door portion 8 is sealed with an O-ring (not shown) and the like.

The chamber 15 is connected with an exhaust unit 29 including an exhaust tube 20, a vacuum pump 21, and a pressure controller 22 so that a degree of vacuum inside the chamber 15 can be arbitrarily controlled.

On a rectangular bottom surface of the main body portion 9 of the chamber 15, each of the first supporting members 6 is provided in the vicinity of each corner of the bottom surface, and the anode electrode 4 is placed on these first supporting members 6. Based on a reason described later, four divided supporting pieces each having a small block shape constitute the first supporting members 6, and the four corners of the anode electrode 4 are supported by these four divided supporting pieces.

Dimensions of the anode electrode 4 are set to appropriate dimensions in accordance with dimensions of a substrate 1 on which the film is to be formed. In the first embodiment, planar dimensions of the substrate 1 are set in a range of 900×550 mm to 1200×750 mm, while planar dimensions of the anode electrode 4 are accordingly set in a range of 1000×600 mm to 1200×800 mm, and a thickness thereof is set in a range of 10 to 50 mm.

The anode electrode 4 can be formed from stainless steel, aluminum alloy, carbon, or the like. In the first embodiment, aluminum alloy is used.

The anode electrode 4 has a hollow structure, and a heater (sheathed heater) 24 is contained in the hollow section. In the anode electrode 4, there remain processing distortions resulting from a machining process adopted for the formation of the hollow structure. Therefore, the anode electrode 4 is subjected to an annealing process before use so that the processing distortions are eliminated. In the annealing process, a closed temperature sensor, such as a thermocouple 25, is used. In the annealing process, a processing temperature is different depending on the type of metal used for the anode electrode 4. In the case where aluminum alloy is used, a temperature cycle, in which the anode electrode 4 is maintained at 345° C. and then slowly cooled down, is generally adopted.

The anode electrode 4 is not fixed with a screw or the like but is merely placed on the first supporting members 6. Accordingly, the anode electrode 4, even when heated and expanded, can slide on the first supporting members 6 by the amount of the expansion, which releases the amount of the expansion. As a result, the anode electrode 4 can be freely deflected downward under its own weight.

The anode electrode 4 and the chamber 15 are electrically connected to each other via four grounding plates. Aluminum plates having a width of 10 to 35 mm and a thickness of 0.5 to 3 mm are used as the grounding plates, which are attached to the four corners of the anode electrode 4.

The cathode electrode 12 is a hollow electrode including the shower plate 2 and the rear plate 3. Both the shower plate 2 and the rear plate 3 can be formed from stainless steel, aluminum alloy, or the like, and are preferably formed from the same material as that of the anode electrode 4. In the first embodiment, aluminum alloy is used.

Dimensions of the cathode electrode 12 are set to appropriate dimensions in accordance with the dimensions of the substrate 1 on which a film is to be formed. In the first embodiment, planar dimensions of the cathode electrode 12 are set in a range of 1000×600 mm to 1200×800 mm, and a thickness thereof is set in a range of 10 to 50 mm so as to have the same dimensions as those of the anode electrode 4.

The inside of the cathode electrode 12 is hollow, and the cathode electrode 12 is connected to the gas introducing portion 28 via a reactant gas tube 23. The reactant gas introduced into the cathode electrode 12 from the gas introducing portion 28 via the reactant gas tube 23 is discharged in the form of shower from a plurality of holes formed in the shower plate 2 of the cathode electrode 12.

Each of the plurality of holes in the shower plate 2 preferably has a diameter of 0.1 to 2.0 mm, and the holes are desirably formed so that an interval between the adjacent holes is of a pitch of a few millimeters to a few centimeters.

There remain processing distortions due to the machining process in shower plate 2 of the cathode electrode 12. Therefore, the shower plate 12 is subjected to the annealing process before use so that the processing distortions can be eliminated therefrom. A processing temperature in the annealing process is different depending on the type of metal used for the cathode electrode 12 and the shower plate 2. In the case where aluminum alloy is used for these components, a temperature cycle, in which these components are maintained at 345° C. and then slowly cooled down, is generally adopted.

The shower plate 2 in the cathode electrode 12 is placed on the total of four second supporting members 5, each of which being provided at each of the four corners distant upward from the bottom surface of the main body portion 9 of the chamber 15. The second supporting members 5 can be formed from glass, alumina, zirconia, or the like. In the first embodiment, alumina or zirconia is used.

The cathode electrode 12 is not fixed with a screw or the like but the shower plate 2 thereof is merely placed on the second supporting members 5. Accordingly, the cathode electrode 12, even when heated and expanded, can slide on the second supporting members 5 by the amount of the expansion, thereby releasing the amount of the expansion. As a result, the cathode electrode 12 can be freely deflected downward under its own weight.

The deflection amounts of the anode electrode 4 and the cathode electrode 12 when they are freely deflected under their own weights, which are the sinking distances thereof, are equal to each other, and maximum deflection amounts of the two electrodes 4 and 12, which are maximum sinking amounts thereof, are also equal to each other. In the first embodiment which uses the cathode electrode 12, in which the length of the long side is approximately 1000 mm, the length of the short side is approximately 600 mm, and the thickness is 15 mm, the maximum deflection amount of the cathode electrode 12 is approximately 1.2 mm. This value is 12% of 10 mm, which is a set distance between the anode electrode 4 and the cathode electrode 12 (inter-electrode distance) used in the first embodiment.

A tolerance (distance accuracy) of the distance between the anode electrode 4 and the cathode electrode 12 facing each other is desirably within a few percent of the set value. The tolerance is thus set because, though there are some changes depending on conditions for the film formation, at least ±10% of irregularity in the film thickness or a region where the film cannot be formed is generated when the tolerance of the distance between the anode electrode 4 and the cathode electrode 12 facing each other is 4% or more of the set value. The tolerance of the distance therebetween is set within 1% in the first embodiment.

In the first embodiment, the square glass substrate 1 having the lengths of approximately 1000 mm×approximately 1000 mm and the thickness of approximately 2 mm is used, and the glass substrate 1 is placed on the square tray 7 having the same dimensions and the thickness of 1.0 mm and formed from aluminum alloy and then set on the anode electrode 4 to be thereby easily moved. In comparison to the anode electrode 4, the glass substrate 1 and the tray 7 are sufficiently thin, light, and less rigid. Therefore, when the glass substrate 1 and the tray 7 are set along the deflection of the anode electrode 4, the deflection of the anode electrode 4 is hardly increased.

The high-frequency power supply unit 30 including a plasma exciting power supply 10 and an impedance matching device 11 is connected to the cathode electrode 12 via a power introducing terminal 27, so that high-frequency power is applied thereto from the high-frequency power supply unit 30. The plasma exciting power supply 10 uses power of 10 W to 100 kW at a frequency of DC to 108.48 MHz. In the first embodiment, power of 10 W to 100 kW at a frequency of 13.56 MHz to 54.24 MHz is used.

In the thin film manufacturing device 100 according to the first embodiment constituted as above, a reactant gas of $SiH_4$ diluted with $H_2$ is introduced thereinto based on a predetermined flow rate and pressure via the cathode electrode 12, and the high-frequency power is applied between the cathode electrode 4 and the anode electrode 4 so that the glow discharge is generated. As a result, a silicon thin film having the film thickness of 300 nm is deposited on the surface of the substrate 1 in the deposition time of ten minutes, with film thickness distribution of ±10% or less.

Second Embodiment

Figure 2:
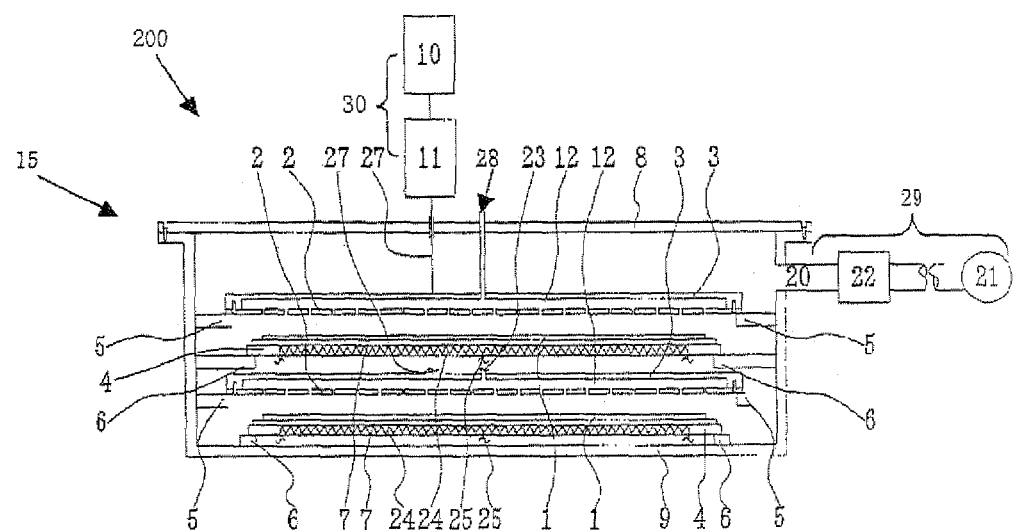
FIG. 2 is an illustration of an entire structure of a plasma processing device (thin film manufacturing device) according to a second embodiment of the present invention.

A plasma processing device for manufacturing a thin film according to a second embodiment is described referring to FIG. 2. A plasma processing device 200 according to the second embodiment has a two-stage structure including two pairs of anode electrodes 4 and cathode electrodes 12 and two pairs of first and second supporting members 6 and 5 inside one chamber 9.

More specifically, the first-stage cathode electrode 12 (supported by the first-stage second supporting member 5) is provided above the first-stage anode electrode 4 supported by the first-stage first supporting member 6. The second-stage first supporting member 6 for supporting the second-stage anode electrode 4 is provided above the first-stage cathode electrode 12. With such a two-stage structure, the two pairs of anode and cathode electrodes 4 and 12 are vertically provided.

In the second embodiment, the plasma processing device 200 has the two-stage structure, however, may have a structure having at least three stages wherein a similar constitution is repeatedly provided.

The components, such as the chamber 15, gas introducing portion 28, exhaust unit 29, high-frequency power supply unit 30, anode and cathode electrodes 4 and 12, and first and second supporting members 6 and 5, are constituted in substantively the same manner as described in the first embodiment.

The invention claimed is:

1. A plasma processing device comprising: a reaction chamber; a gas introducing portion that introduces a reactant gas into the reaction chamber; an exhaust unit that discharges the reactant gas from the reaction chamber; a first electrode and a second electrode supported in the reaction chamber and having a flat-plate shape; and a first supporting member and a second supporting member that support the first and second electrodes such that the electrodes face each other, wherein maximum deflection amounts of the first and second electrodes, which are maximum sinking distances under their own weights, in a state where the first and second electrodes are supported by the first and second supporting members, are adapted to be equal to each other, and wherein the first and second electrodes are distant from each other by a predetermined inter-electrode distance, and wherein the shapes, sizes, and materials of the first and second electrodes are adapted in such a manner that maximum deflection amounts thereof are at least 1% of the inter-electrode distance, and wherein the first and second electrodes are subjected to an annealing process, and wherein the thickness of the first and second electrodes are set in a range of 10 to 50 mm.

2. The plasma processing device according to claim 1, wherein the first and second electrodes have a hollow structure.

3. The plasma processing device according to claim 1, wherein the first and second electrodes are supported to be movable in a limited range.

4. The plasma processing device according to claim 1, wherein a material used for the first and second electrodes is aluminum alloy.

5. The plasma processing device according to claim 1, wherein
   a substrate to be processed is provided between the first and second electrodes in a state where the substrate is deflected along the deflection of the two electrodes.

6. The plasma processing device according to claim 5, further comprising a tray having a thin-plate shape on which the substrate is placed.

7. The plasma processing device according to claim 6, wherein the substrate is set on the tray.

* * * * *